United States Patent
Yang

(10) Patent No.: US 7,336,089 B2
(45) Date of Patent: Feb. 26, 2008

(54) POWER LINE CONTROL CIRCUIT OF SEMICONDUCTOR DEVICE

(75) Inventor: Jong Yeol Yang, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/490,244

(22) Filed: Jul. 21, 2006

(65) Prior Publication Data

US 2007/0114554 A1    May 24, 2007

(30) Foreign Application Priority Data

Nov. 24, 2005  (KR) .................... 10-2005-0112981

(51) Int. Cl.
*G01R 31/02* (2006.01)
*H03K 17/00* (2006.01)
*H01L 29/00* (2006.01)

(52) U.S. Cl. .................. 324/763; 327/403; 327/565; 257/48

(58) Field of Classification Search ............. 324/763; 327/403, 565; 257/48
See application file for complete search history.

(56) References Cited

U.S. PATENT DOCUMENTS 5,146,428 A * 9/1992 Tanimura .............. 365/189.08
5,345,098 A * 9/1994 Hirabayashi et al. ........ 257/207
2006/0095874 A1* 5/2006 Jiang et al. .................. 716/2

FOREIGN PATENT DOCUMENTS

KR    1020010004222    1/2001

* cited by examiner

*Primary Examiner*—Evan Pert
(74) *Attorney, Agent, or Firm*—Lowe Hauptman Ham & Berner LLP

(57) ABSTRACT

A power line control circuit of a semiconductor device in which a width of a power line can be selectively controlled. The power line control circuit of the semiconductor device according to the present invention can selectively control the width of the power line employing the dummy power line. It is therefore possible to easily change the width of the power lines and to reduce the manufacturing cost and the manufacturing time depending on the formation of the power lines. Furthermore, the power line control circuit of the semiconductor device according to the present invention can selectively control the width of the power lines, if appropriate. Accordingly, mesh of optimized power lines can be provided. Furthermore, more stabilized product characteristics can be secured and the yield of semiconductor memory devices can be enhanced. In addition, the power line control circuit of the semiconductor device according to the present invention can selectively change power mesh corresponding to a power line method or operation mode of a product.

34 Claims, 9 Drawing Sheets

POWER LINE CONTROL CIRCUIT OF SEMICONDUCTOR DEVICE

BACKGROUND

1. Field of the Invention

The present invention generally relates to semiconductor devices, and more particularly, to a power line control circuit of a semiconductor device.

2. Discussion of Related Art

In general, internal circuits included in the semiconductor device employ internal voltages, which are generated based on externally supplied and relatively high voltages, as operating power thereof. For this end, the semiconductor device includes power lines for transmitting the internal circuits with the internal voltages, respectively. The arrangement of the power lines and the widths of the power lines may be varied depending on the operating environments of the semiconductor device, the size of the semiconductor device and/or the like.

In recent years, with the developments of semiconductor manufacture technology, the power lines has become minute as the semiconductor device is miniaturized and is more highly integrated. However, as the width of the power line is narrowed, a resistance value of the power line is increased. As a result, the internal voltages transferred through the power lines are lowered due to voltage drop incurred by the resistance of the power lines.

If the internal voltages are lowered as described above, however, the internal circuits may malfunction. Therefore, the width of the power lines must be properly controlled depending on the operating characteristics of the internal circuits.

In other words, it is preferred that the power lines are formed such that the internal circuits of the semiconductor device operate in an optimal way. Consequently, proper arrangement of the power lines and the width of the power lines may play an important role in improving the operating performance of the semiconductor device.

FIG. 1 is a view schematically illustrating power lines and internal circuits of a semiconductor device in the related art.

Referring to FIG. 1, internal circuits 21 to 26 are connected to power lines 11 to 13, respectively. The power lines 11 to 13 are formed to have widths D1, D2, and 3D such that the internal circuits 21 to 26 operate in an optimal state.

To decide the widths of the power lines 11 to 13, which meet the optimal operating condition of the internal circuits 21 to 26, a power line formation process employing a mask must be repeatedly performed. This is because it does not know whether the internal circuits 21 to 26 can operate as an optimal state when each of the power lines 11 to 13 has what width. Therefore, a manufacturer can decide an optimal width of each of the power lines 11 to 13 by increasing or decreasing the widths of the power lines 11 to 13 through a test process.

This will be described in more detail. In the test process, the manufacturer confirms the operating state of each of the internal circuits 21 to 26 while changing the width of each of the power lines 11 to 13 using a pattern process employing a mask. As a result, the widths of the power lines 11 to 13, in which the internal circuits 21 to 26 can operation optimally, can be decided.

In the test process, however, the pattern processes of the power lines 11 to 13 must be repeatedly carried out in order to decide the widths of the power lines 11 to 13. Accordingly, a problem arises because the manufacturing cost and the manufacturing time of the power lines 11 to 13 are increased.

SUMMARY OF THE INVENTION

An embodiment of the present invention is that it provides a power line control circuit of a semiconductor device, in which the width of power lines can be changed easily and the manufacturing cost and the manufacturing time depending on the formation of the power lines can be reduced, by selectively controlling the width of the power lines using dummy power lines.

A power line control circuit of a semiconductor device according to an aspect of the present invention includes a first dummy line, a second dummy line, a first line width change circuit, and a second line width change circuit. The first dummy line is disposed adjacent to a first power line that transmits a first internal voltage to first internal circuits. The second dummy line is disposed adjacent to a second power line that transmits a second internal voltage to second internal circuits. The first line width change circuit connects or disconnects one of or both the first and second dummy lines to or from the first power line in response to first and second selection signals, thereby selectively changing the width of the first power line. The second line width change circuit connects or disconnects one of or both the first and second dummy lines to or from the second power line in response to third and fourth selection signals, thereby selectively changing the width of the second power line.

A power line control circuit of a semiconductor device according to another aspect of the present invention includes first to $M^{th}$ (M is an integer) dummy line groups, first line width change circuits, and second line width change circuits. The first to $M^{th}$ dummy line groups are included in first to $M^{th}$ power line groups, respectively, and include first and second dummy lines respectively disposed between first and second power lines that transmit different internal voltages, respectively. The first line width change circuits connect or disconnect one or all of the first and second dummy lines of each of the first to $M^{th}$ dummy line groups to or from the first power line of each of the first to $M^{th}$ power line groups in response to first selection signals and second selection signals, respectively, thereby selectively changing a width of each of the first power lines. The second line width change circuits connect or disconnect one or all of the first and second dummy lines of each of the first to $M^{th}$ dummy line groups to or from the second power line of each of the first to $M^{th}$ power line groups in response to third selection signals and fourth selection signals, respectively, thereby selectively changing a width of each of the second power lines;

A power line control circuit of a semiconductor device according to further another aspect of the present invention includes first to $M^{th}$ (M is an integer) dummy line groups, first line width change circuits, and second line width change circuits. The first to $M^{th}$ dummy line groups are included in first to $M^{th}$ power line groups, respectively, and include first and secondK (K is an integer) dummy lines respectively disposed between first and second power lines that transmit different internal voltages, respectively. The first line width change circuits connect or disconnect one or all of the first and secondK dummy lines of each of the first to $M^{th}$ dummy line groups to or from the first power line of each of the first to $M^{th}$ power line groups in response to first selection signals and second selection signals, respectively, thereby selectively changing a width of each of the first power lines. The } second line width change circuits connect or disconnect one or all of the first and secondK dummy lines of each of the first to $M^{th}$ dummy line groups to or from the second power line of each of the first to $M^{th}$ power line groups in response to third selection signals and fourth selection signals, respectively, thereby selectively changing a width of each of the second power lines.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The present invention will now be described in detail in connection with certain exemplary embodiments with reference to the accompanying drawings.

Figure 1:
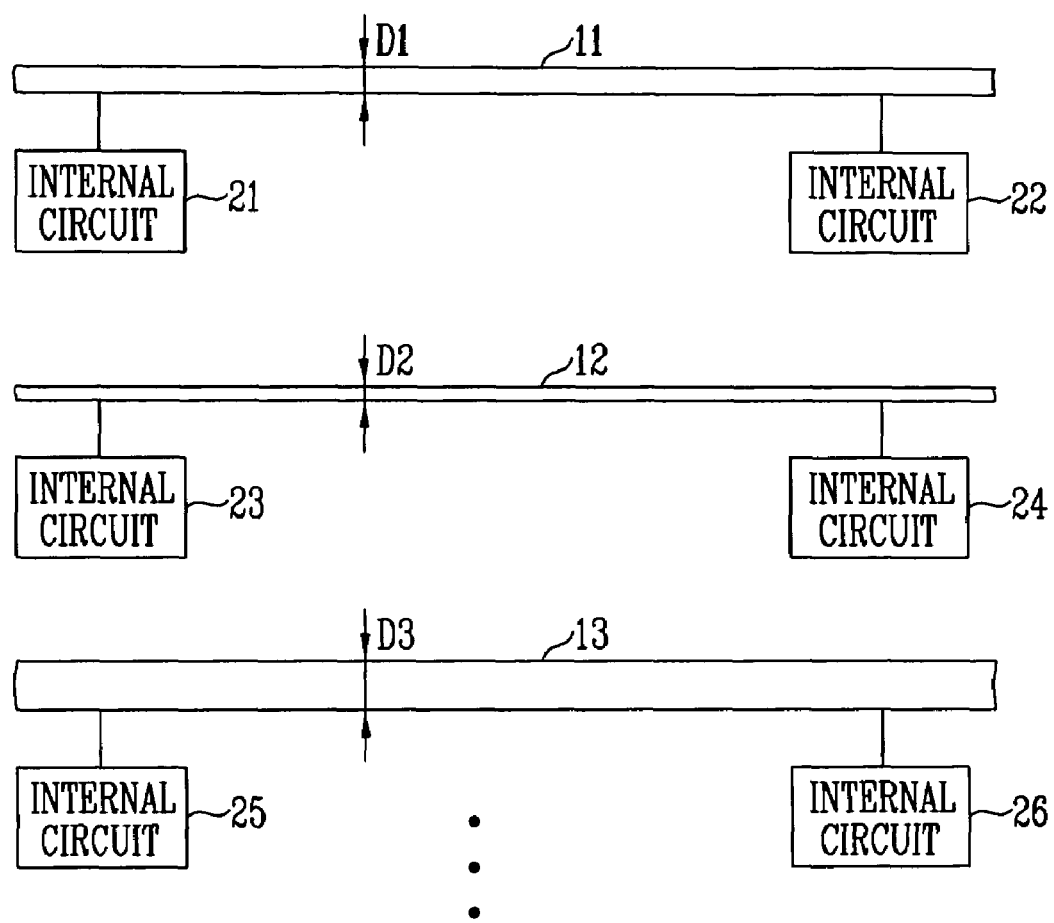
FIG. 1 is a view schematically illustrating power lines and internal circuits of a semiconductor device in the related art.
Figure 2:
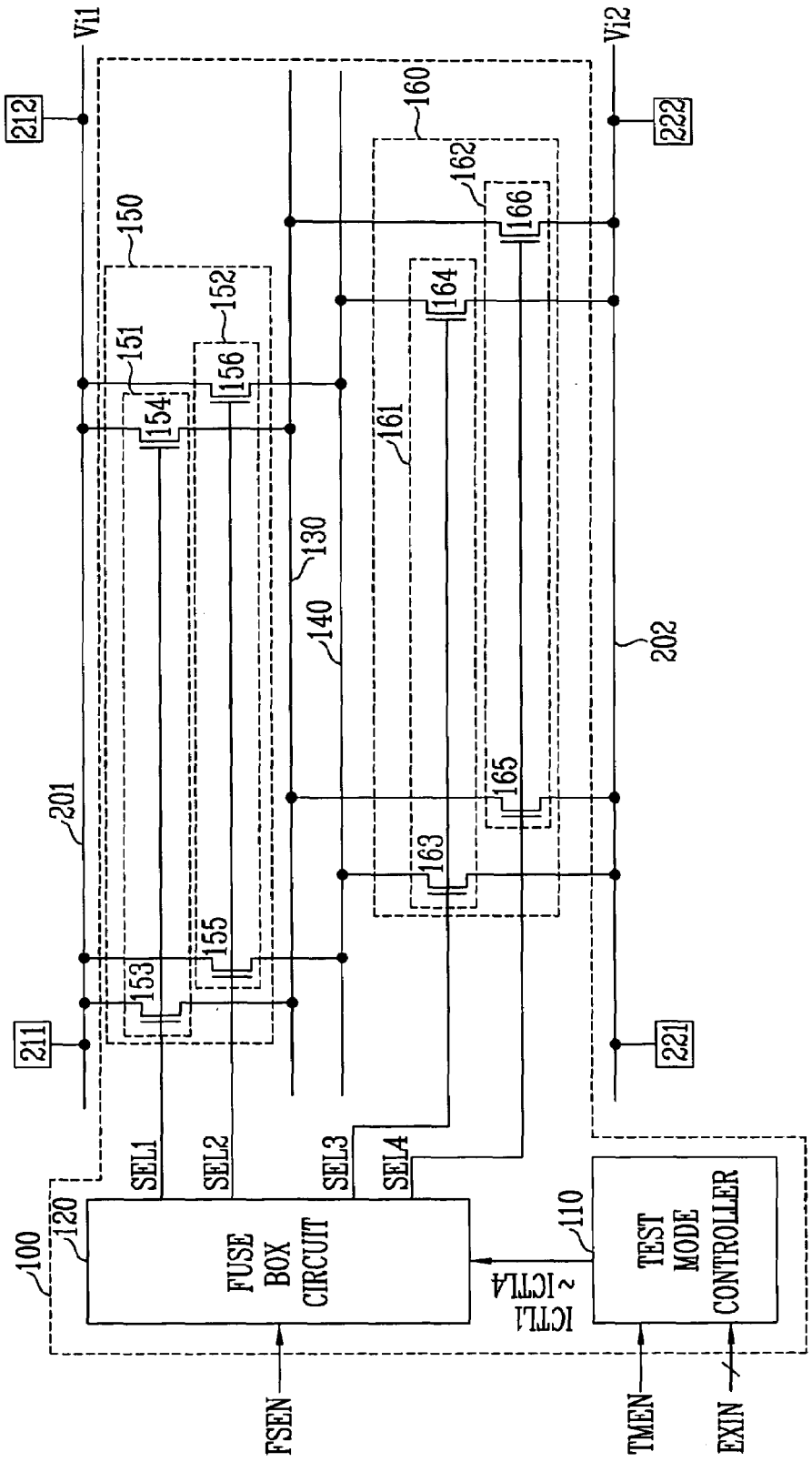
FIG. 2 is a circuit diagram illustrating a power line control circuit, power lines and internal circuits of a semiconductor device according to a first embodiment of the present invention.

FIG. 2 is a circuit diagram illustrating a power line control circuit, power lines and internal circuits of a semiconductor device according to a first embodiment of the present invention.

Referring to FIG. 2, the power line control circuit 100 includes a test mode controller 110, a fuse box circuit 120, dummy lines 130, 140, and line width change circuits 150, 160.

The test mode controller 110 generates control signals ICTL1 to ICTL4 in response to a test mode control signal TMEN and an externally inputted signal EXIN. The externally inputted signal EXIN may be set to N (N is an integer) bits. The test mode controller 110 is enabled or disabled in response to the test mode control signal TMEN.

For example, when the test mode control signal TMEN is enabled, the test mode controller 110 may be enabled. The test mode controller 110 enables or disables a portion of the control signals ICTL1 to ICTL4 based on a bit value of the externally inputted signal EXIN when being enable. For example, in the case where the power line control circuit 100 is applied to the semiconductor memory device, the externally inputted signal EXIN may become an address signal.

The fuse box circuit 120 generates selection signals SEL1 to SEL4 in response to a fuse enable signal FSEN or the control signals ICTL1 to ICTL4. In more detail, when the fuse enable signal FSEN is disabled, the fuse box circuit 120 generates the selection signals SEL1 to SEL4 in response to the control signals ICTL1 to ICTL4. Meanwhile, when the fuse enable signal FSEN is enabled, the fuse box circuit 120 generates the selection signals SEL1 to SEL4 in response to the fuse enable signal FSEN.

Preferably, when the test mode control signal TMEN is enabled, the fuse enable signal FSEN may be disabled. When the test mode control signal TMEN is disabled, the fuse enable signal FSEN may be enabled. Therefore, the fuse box circuit 120 operates in response to any one of the control signals ICTL1 to ICTL4 and the fuse enable signal FSEN.

Figure 3:
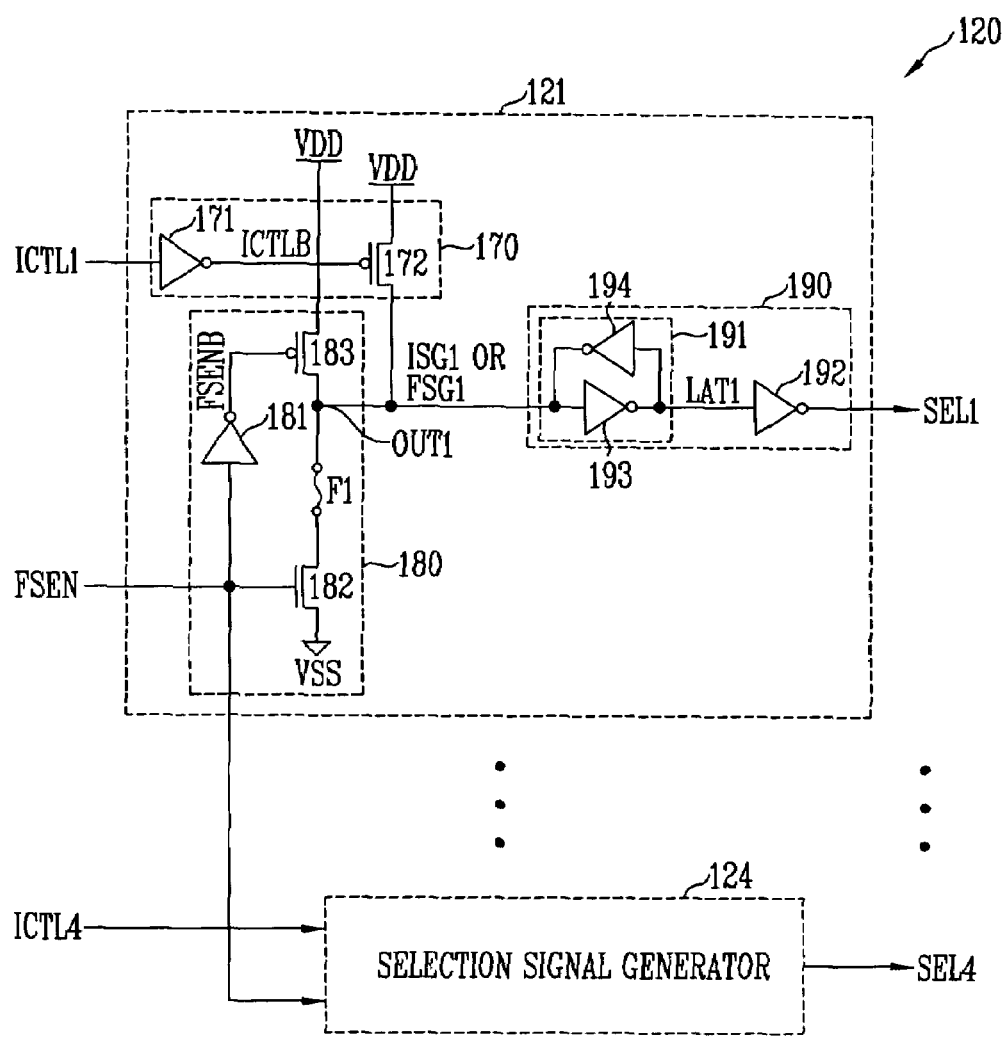
FIG. 3 is a detailed circuit diagram of a fuse box circuit shown in FIG. 2 according to an embodiment of the present invention.

The construction and detailed operation of the fuse box circuit 120 will be described below in more detail with reference to FIG. 3. The fuse box circuit 120 includes selection signal generators 121 to 124. The selection signal generators 121 to 124 have the same constructions and operations, and only the selection signal generator 121 will be described as an example.

The selection signal generator 121 includes a test operation circuit 170, a normal operation circuit 180, and an output circuit 190.

The test operation circuit 170 generates an internal signal ISG1 to an output node OUT1 in response to the control signal ICTL1. In more detail, when the control signal ICTL1 is enabled, the test operation circuit 170 generates the internal signal ISG1. The test operation circuit 170 may be implemented using an inverter 171 and a PMOS transistor 172. The inverter 171 inverts the control signal ICTL1 and outputs an inverted control signal ICTL1B. The PMOS transistor 172 is turned on or off in response to the inverted control signal ICLT1B. The PMOS transistor 172 is turned on to supply an internal voltage VDD to the output node OUT1. As a result, the internal signal ISG1 of the internal voltage (VDD) level is generated from the output node OUT1.

The normal operation circuit 180 generates a fuse signal FSG1 the output node OUT1 in response to a fuse enable signal FSEN. The normal operation circuit 180 includes an inverter 181, switching circuits 182, 183, and a fuse F1.

The inverter 181 inverts the fuse enable signal FSEN and outputs an inverted fuse enable signal FSENB. The switching circuit 182 is connected to a ground voltage VSS and is turned on or off in response to the fuse enable signal FSEN. The switching circuit 183 is connected between the internal voltage VDD and the output node OUT1 and is turned on or off in response to the inverted fuse enable signal FSENB. Each of the switching circuits 182, 183 may be implemented using a NMOS transistor. The fuse F1 is connected between the output node OUT1 and the switching circuit 182. The fuse F1 may be cut electrically or by a laser.

In the case where the fuse F1 is cut, the normal operation circuit 180 outputs the fuse signal FSG1 of the internal voltage (VDD) level to the output node OUT1 when the fuse enable signal FSEN is enabled. In contrast, in the case where the fuse F1 is not cut, the normal operation circuit 180 outputs the fuse signal FSG1 of the ground voltage (VSS) level to the output node OUT1 when the fuse enable signal FSEN is enabled.

The output circuit 190 includes a latch circuit 191 and an inverter 192. The latch circuit 191 includes inverters 193, 194. The latch circuit 191 latches the internal signal ISG1 or the fuse signal FSG1 received from the output node OUT1 and outputs a latched signal LAT1. The inverter 192 inverts the latched signal LAT1 and outputs an inverted signal as a selection signal SEL1.

Referring back to FIG. 2, the dummy line 130 is disposed adjacent to a power line 201 for transmitting an internal voltage Vi1 to internal circuits 211, 212. Furthermore, the dummy line 140 is disposed adjacent to a power line 202 for transmitting an internal voltage Vi2 to internal circuits 221, 222.

A width of each of the dummy lines 130, 140 may be set to be the same as or larger than that of each of the power lines 201, 202. In FIG. 2, it has been shown that two internal circuits are connected to the power lines 201, 202, respectively, but the number of the internal circuits connected to the power lines 201, 202 may be increased or decreased, if appropriate.

The internal voltages Vi1, Vi2 may be different voltage levels or the same voltage level. For example, in the event that the power line control circuit 100 is included in a semiconductor memory device, each of the internal voltages Vi1, Vi2 may be one of voltages Vcore, Vpp, Vperi, Vbb, and Vcc.

The line width change circuit 150 connects or disconnects one of or both the dummy lines 130, 140 to or from the power line 201 in response to the selection signals SEL1, SEL2 in order to selectively change the width of the power line 201. If one of or both the dummy lines 130, 140 are connected to the power line 201 as described above, the same effect in which the width of the power line 201 is increased can be obtained. Accordingly, the larger the number of the dummy lines connected to the power line 201, the wider the width of the power line 201.

The line width change circuit 150 includes switching circuits 151, 152. The switching circuit 151 includes NMOS transistors 153, 154. The NMOS transistors 153, 154 are respectively connected between the power line 201 and the dummy line 130 and are tuned on or off in response to the selection signal SEL1. The switching circuit 152 includes NMOS transistors 155, 156. The NMOS transistors 155, 156 are respectively connected between the power line 201 and the dummy line 140 and are tuned on or off in response to the selection signal SEL2.

In a similar way to the line width change circuit 150, the line width change circuit 160 connects or disconnects one of both the dummy lines 130, 140 to or from the power line 202 in response to the selection signals SEL3, SEL4, thereby selectively changing the width of the power line 202.

The line width change circuit 160 includes switching circuits 161, 162. The switching circuit 161 includes NMOS transistors 163, 164. The NMOS transistors 163, 164 are respectively connected between the power line 202 and the dummy line 140 and are tuned on or off in response to the selection signal SEL3. Furthermore, the switching circuit 162 includes NMOS transistors 165, 166. The NMOS transistors 165, 166 are respectively connected between the power line 202 and the dummy line 130 and are turned on or off in response to the selection signal SEL4.

The process of controlling the widths of the power lines 201, 202 using the power line control circuit 100 will be described below in more detail.

A test process for deciding the widths of the power lines 201, 202 in which the internal circuits 211, 212, 221, and 222 may operate optimally, is first performed. As the fuses of the fuse box circuit 120 are selectively cut corresponding to the results decided in the test process, the power line control circuit 100 fixes a width of each of the power lines 201, 202 to a predetermined width.

The test process will be described below in more detail. It is assumed that the fuse F1 of each of the selection signal generators 121 to 124 included in the fuse box circuit 180 is not cut.

If the fuse enable signal FSEN is disabled after being enabled for a predetermined time, the normal operation circuit 180 of each of the selection signal generators 121 to 124 outputs the fuse signal FSG1 of the ground voltage (VSS) level (i.e., logical "low") to the output node OUT1. This will be described below in more detail.

When the fuse enable signal FSEN is enabled, the switching circuits 182, 183 of the normal operation circuit 180 are turned on. Since the fuse F1 is not cut, the normal operation circuit 180 outputs the fuse signal FSG1 of the ground voltage (VSS) level to the output node OUT1. The output circuit 190 of each of the selection signal generators 121 to 124 latches the fuse signal FSG1, disables the selection signals SEL1 to SEL4 and outputs the disabled signals.

Thereafter, the test mode control signal TMEN is enabled and the externally inputted signal EXIN is inputted to the test mode controller 110. The test mode controller 110 is enabled in response to the test mode control signal TMEN and enables some or all of the control signals ICTL1 to ICTL4 based on a bit value of the externally inputted signal EXIN.

For example, when the externally inputted signal EXIN is 4 bits and has a bit value of "1100", the test mode controller 110 enables the control signals ICTL1, ICTL2 and disables the control signals ICTL3, ICTL4. As a result, the test operation circuit 170 of each of the selection signal generators 121, 122 outputs the internal signal ISG1 of the internal voltage (VDD) level (i.e., logical "high") to the output node OUT1 in response to the control signals ICTL1, ICTL2.

Therefore, the selection signal generators 121, 122 enable the selection signals SEL1, SEL2, respectively. Meanwhile, since the control signals ICTL3, ICTL4 are disabled, the test operation circuit 170 of each of the selection signal generators 123, 124 does not operate. As a result, the selection signal generators 123, 124 keep disable the selection signals SEL3, SEL4.

The NMOS transistors 153 to 156 of the line width change circuit 150 are all turned on in response to the selection signals SEL1, SEL2 to connect the dummy lines 130, 140 to the power line 201. Meanwhile, since the NMOS transistors 163 to 166 of the line width change circuit 160 are turned off in response to the selection signals SEL3, SEL4, the dummy lines 130, 140 are all separated from the power line 202. Consequently, the width of the power line 201 is set larger than that of the power line 202 by means of the dummy lines 130, 140.

At this time, if the internal circuits 211, 212, 221, and 222 do not operate in an optimal state, a bit value of the externally inputted signal EXIN is changed and the above-mentioned test process is repeatedly performed. Meanwhile, if all the internal circuits 211, 212, 221, and 222 operate in an optimal state, the fuses of the fuse box circuit 120 are selectively cut corresponding to the results of the test process. Thereafter, if the fuse enable signal FSEN is enabled, both the switching circuits 182, 183 of each of the selection circuits 121 to 124 are turned on.

At this time, if it is assumed that the fuse F1 of each of the selection circuits 121, 122 is cut and the fuse F1 of each of the selection circuits 123, 124 is not cut, the selection circuits 121, 122 enable the selection signals SEL1, SEL2 and outputs the enabled signals, and the selection circuits 123, 124 disable the selection signals SEL3, SEL4 and outputs the disabled signals. As a result, the line width change circuits 150, 160 separate the dummy lines 130, 140 from the power line 202 while connecting the dummy lines 130, 140 to the power line 201, in response to the selection signals SEL1 to SLE4.

As a result, the widths of the power lines 201, 202 can be fixed corresponding to the results decided in the test process. As described above, the power line control circuit 100 can selectively control the widths of the power lines 201, 202 using the dummy lines 130, 140. Accordingly, the cost and time necessary to form the power lines 201, 202 can be saved.

Figure 4:
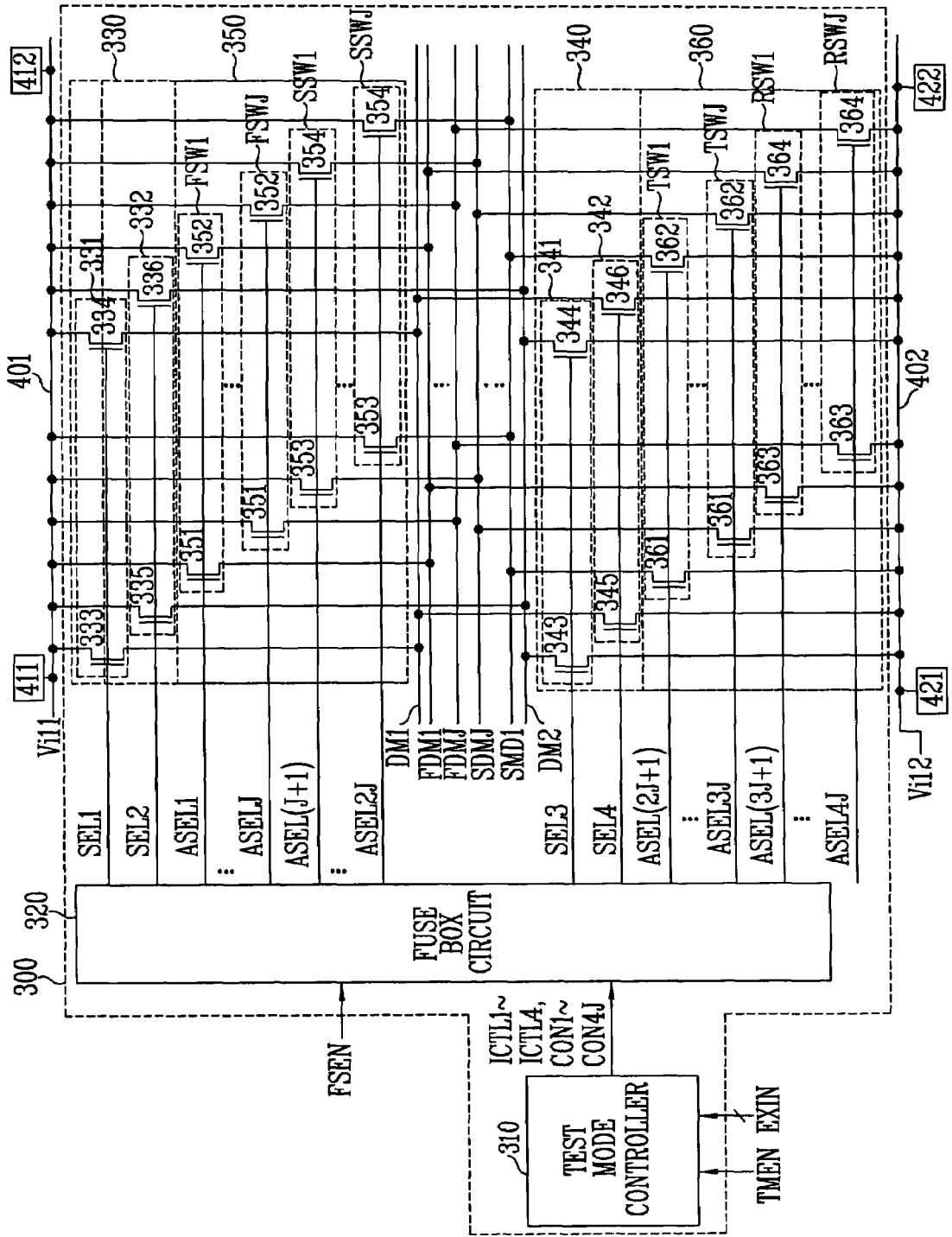
FIG. 4 is a circuit diagram illustrating a power line control circuit, power lines and internal circuits of a semiconductor device according to a second embodiment of the present invention.

FIG. 4 is a circuit diagram illustrating a power line control circuit, power lines and internal circuits of a semiconductor device according to a second embodiment of the present invention.

Referring to FIG. 4, the power line control circuit 300 includes a test mode controller 310, a fuse box circuit 320, dummy lines DM1, DM2, line width change circuits 330, 340, additional dummy lines FDM1 to FDMJ, SDM1 to SDMJ (J is an integer), and additional line width change circuits 350, 360. The construction and overall operation of the power line control circuit 300 are substantially the same as those of the power line control circuit 100 according to the first embodiment except for several differences. Accordingly, only the differences will be described.

The power line control circuit 300 is different from the power line control circuit 300 in that it further includes the additional dummy lines FDM1 to FDMJ, SDM1 to SDMJ and the additional line width change circuits 350, 360. The power line control circuit 300 is also different from the power line control circuit 300 in that the test mode controller 310 further generates control signals CON1 to CON4J (J is an integer) and the fuse box circuit 320 further generates selection signals ASEL1 to ASEL4J.

The additional dummy lines FDM1 to FDMJ are disposed close to a dummy line DM1 and the additional dummy lines SDM1 to SDMJ are disposed close to a dummy line DM2. A width of each of the additional dummy lines FDM1 to FDMJ, SDM1 to SDMJ may be set to be the same as or larger than that of each of the power lines 401, 402.

Alternatively, a width of each of the additional dummy lines FDM1 to FDMJ, SDM1 to SDMJ may be set differently. That is, the widths of the additional dummy lines FDM1 to FDMJ may be set to be gradually increased in order of FDM1, FDM2, . . . , FDMJ and the widths of the additional dummy lines SDM1 to SDMJ may be set to be gradually increased in order of SDM1, SDM2, . . . , SDMJ.

Furthermore, the test mode controller 310 is enabled when a test mode control signal TMEN is enabled and generates control signals ICTL1 to ICTL4 and control signals CON1 to CON4J based on a bit value of an externally inputted signal EXIN. At this time, the test mode controller 310 enables a portion of the control signals ICTL1 to ICTL4 and a portion of the control signals CON1 to CON4J. The fuse box circuit 320 generates selection signals SEL1 to SEL4, ASEL1 to ASEL4J in response to the control signals ICTL1 to ICTL4, CON1 to CON4J.

Figure 5:
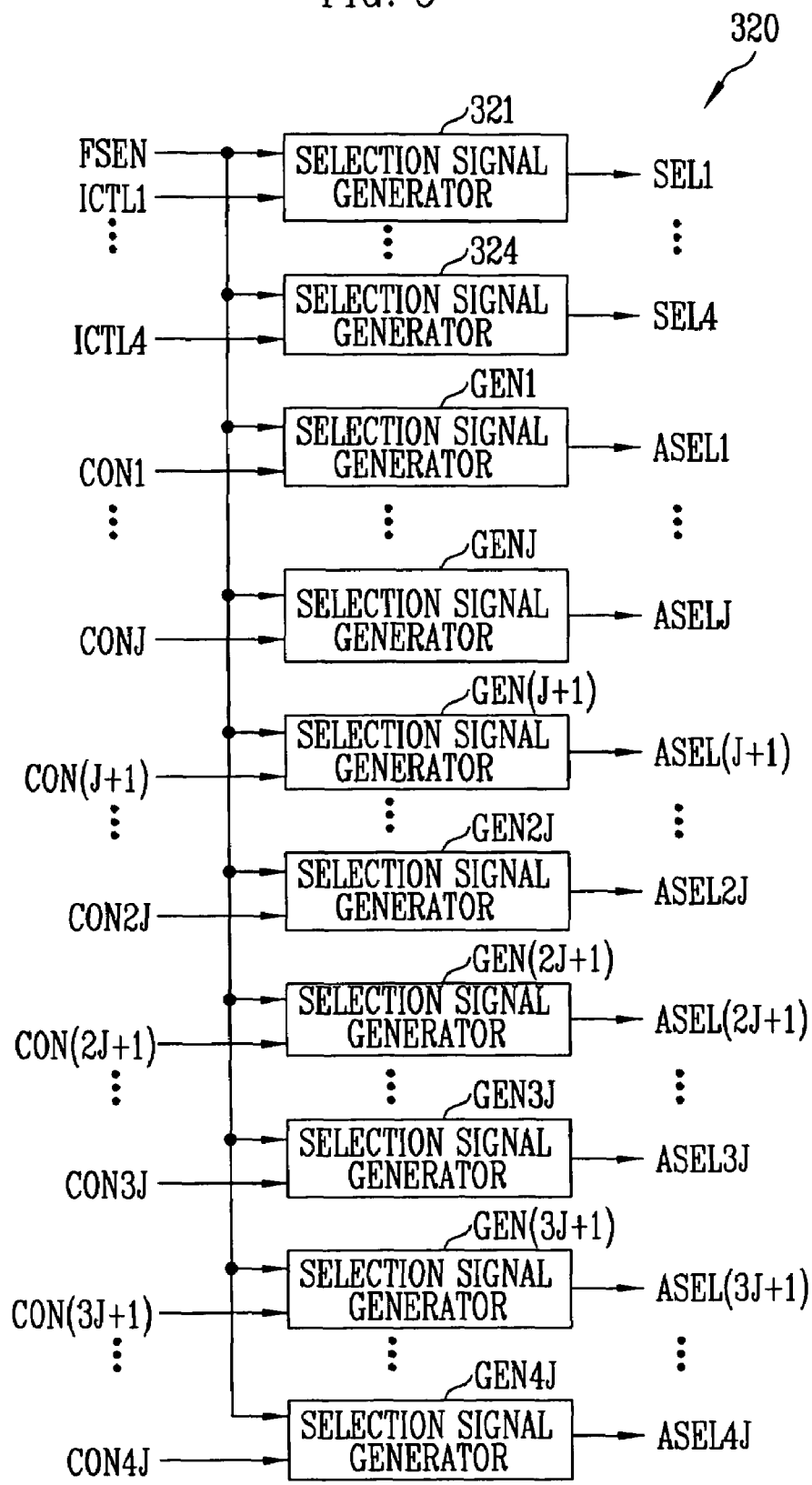
FIG. 5 is a detailed circuit diagram of a fuse box circuit shown in FIG. 4 according to an embodiment of the present invention.

The construction and operation of the fuse box circuit 320 will be described below in more detail with reference to FIG. 5.

The fuse box circuit 320 includes selection signal generators 321 to 324, GEN1 to GEN4J (J is an integer). The selection signal generators 321 to 324 generate the selection signals SEL1 to SEL4, respectively, in response to a fuse enable signal FSEN or control signals ICTL1 to ICTL4, respectively.

Furthermore, the selection signal generators GEN1 to GEN4J generate the selection signals ASEL1 to ASEL4J, respectively, in response to the fuse enable signal FSEN or the control signals CON1 to CON4J. The construction and detailed operation of each of the selection signal generators 321 to 324, GEN1 to GEN4J are substantially the same as that of the selection signal generator 121, which has been described with reference to FIG. 3. Description thereof will be omitted.

Referring back to FIG. 4, the line width change circuit 330 includes switching circuits 331, 332. The switching circuits 331, 332 connect or disconnect the dummy lines DM1, DM2, respectively, to or from a power line 401 in response to the selection signals SEL1, SEL2, respectively, thereby selectively changing the width of the power line 401. The power line 401 transmits an internal voltage Vi11 to internal circuits 411, 412.

Furthermore, the additional line width change circuit 350 includes switching circuits FSW1 to FSWJ, SSW1 to SSWJ (J is an integer). The switching circuits FSW1 to FSWJ connect or disconnect the additional dummy lines FDM1 to FDMJ, respectively, to or from the power line 401 in response to the selection signals ASEL to ASELJ, respectively. Furthermore, the switching circuits SSW1 to SSWJ connect or disconnect the additional dummy lines SDM1 to SDMJ, respectively, to or from the power line 401 in response to selection signals ASEL(J+1) to ASEL2J. At this time, the larger the number of the dummy lines connected to the power line 401, the larger the width of the power line 401.

The line width change circuit 340 includes switching circuits 341, 342. The switching circuits 341, 342 connect or disconnect the dummy lines DM2, DM1, respectively, to or from a power line 402 in response to the selection signals SEL3, SEL4, respectively, thereby selectively changing the width of the power line 402. The power line 402 transmits an internal voltage Vi12 to the internal circuits 421, 422.

Furthermore, the additional line width change circuit 360 includes switching circuits TSW1 to TSWJ, RSW1 to RSWJ (J is an integer). The switching circuits TSW1 to TSWJ connect or disconnect the additional dummy lines SDM1 to SDMJ, respectively, to or from the power line 402 in response to the selection signals ASEL(2J+1) to ASEL3J, respectively. The switching circuits RSW1 to RSWJ connect or disconnect the additional dummy lines FDM1 to FDMJ, respectively, to or from the power line 402 in response to the selection signals ASEL (3J+1) to ASEL4J, respectively. At this time, the larger the number of the dummy lines connected to the power line 402, the larger the width of the power line 402.

As described above, in the power line control circuit 300, the line width change circuits 330, 340 selectively connect or disconnect the dummy lines DM1, DM2 to or from the power lines 401, 402, thereby freely controlling the widths of the power lines 401, 402. Furthermore, the additional line width change circuits 350, 360 further selectively connect or disconnect the additional dummy lines FDM1 to FDMJ, SDM1 to SDMJ to or from the power lines 401, 402, so that the widths of the power lines 401, 402 can be controlled more accurately.

Figure 6:
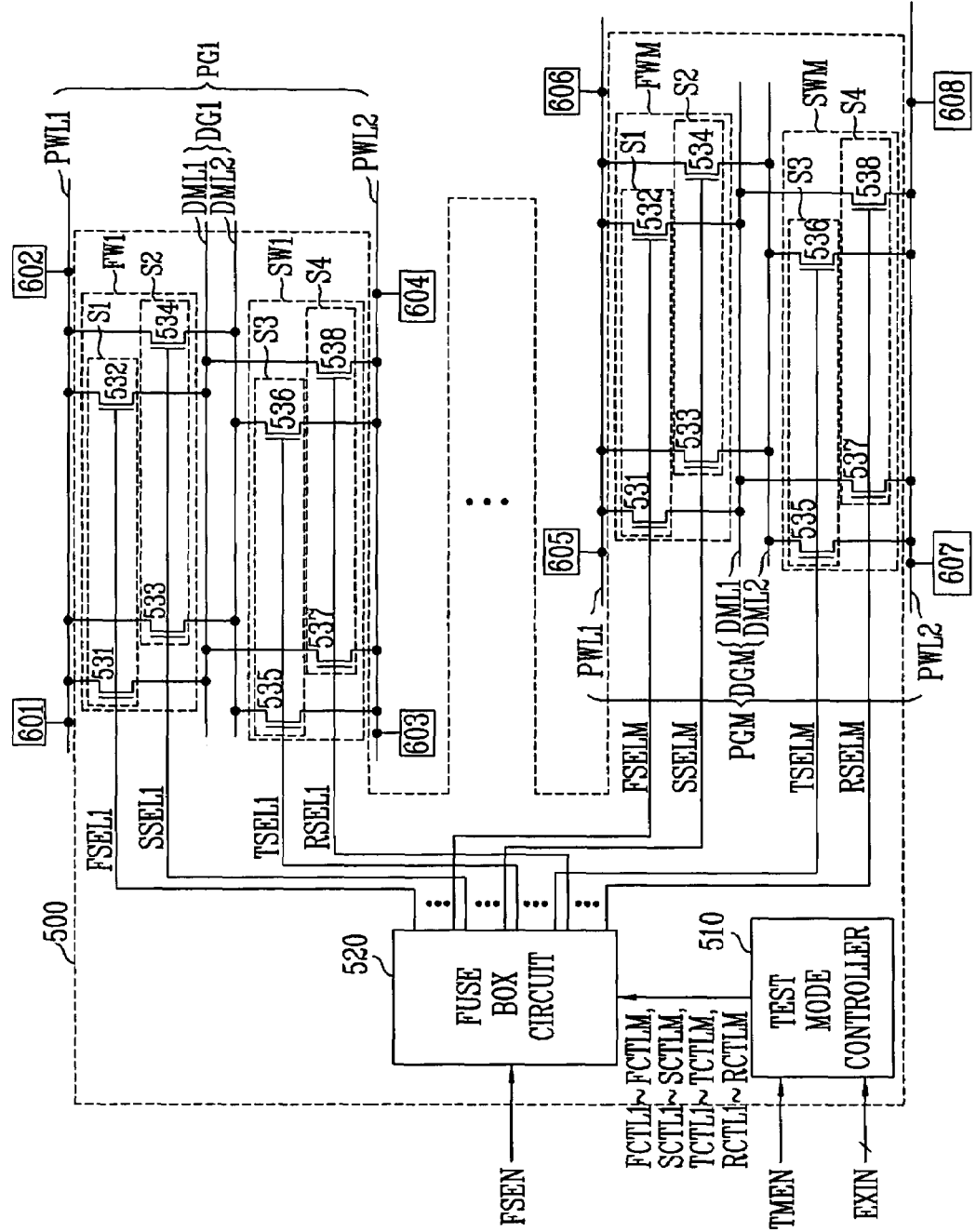
FIG. 6 is a circuit diagram illustrating a power line control circuit, power lines and internal circuits of a semiconductor device according to a third embodiment of the present invention.

FIG. 6 is a circuit diagram illustrating a power line control circuit, power lines and internal circuits of a semiconductor device according to a third embodiment of the present invention.

Referring to FIG. 6, the power line control circuit 500 includes a test mode controller 510, a fuse box circuit 520, dummy line groups DG1 to DGM (M is an integer), and line width change circuits FW1 to FWM, SW1 to SWM (M is an integer). The construction and operation of the power line control circuit 500 are substantially the same as those of the power line control circuit 100 according to the first embodiment except for several differences. Accordingly, only the differences will be described.

The power line control circuit 500 is different from the power line control circuit 100 in that it includes dummy line groups DG1 to DGM and line width change circuits FW1 to FWM, SW1 to SWM. The power line control circuit 500 is also different from the power line control circuit 100 in that the test mode controller 510 generates first to fourth control signals FCTL1 to FCTLM, SCTL1 to SCTLM, TCTL1 to TCTLM, and RCTL1 to RCTLM (M is an integer) and the fuse box circuit 520 generates first to fourth selection signals FSEL1 to FSELM, SSEL1 to SSELM, TSEL1 to TSELM, and RSEL1 to RSELM.

Each of the dummy line groups DG1 to DGM includes dummy lines DML1, DML2 disposed between power lines PWL1, PWL2 of each of the power line groups PG1 to PGM (M is an integer). For example, the dummy lines DML1, DML2 of the dummy line group DG1 is disposed between the power lines PWL1, PWL2 of the power line group PG1. The power line groups PG1 to PGM serve as paths along which different internal voltages are transmitted.

Furthermore, the test mode controller 510 is enabled when a test mode control signal TMEN is enabled and generates the first to fourth control signals FCTL1 to FCTLM, SCTL1 to SCTLM, TCTL1 to TCTLM, and RCTL1 to RCTLM based on a bit value of an externally inputted signal EXIN. At this time, the test mode controller 510 enables a portion of the first to fourth control signals FCTL1 to FCTLM, SCTL1 to SCTLM, TCTL1 to TCTLM, and RCTL1 to RCTLM.

Figure 7:
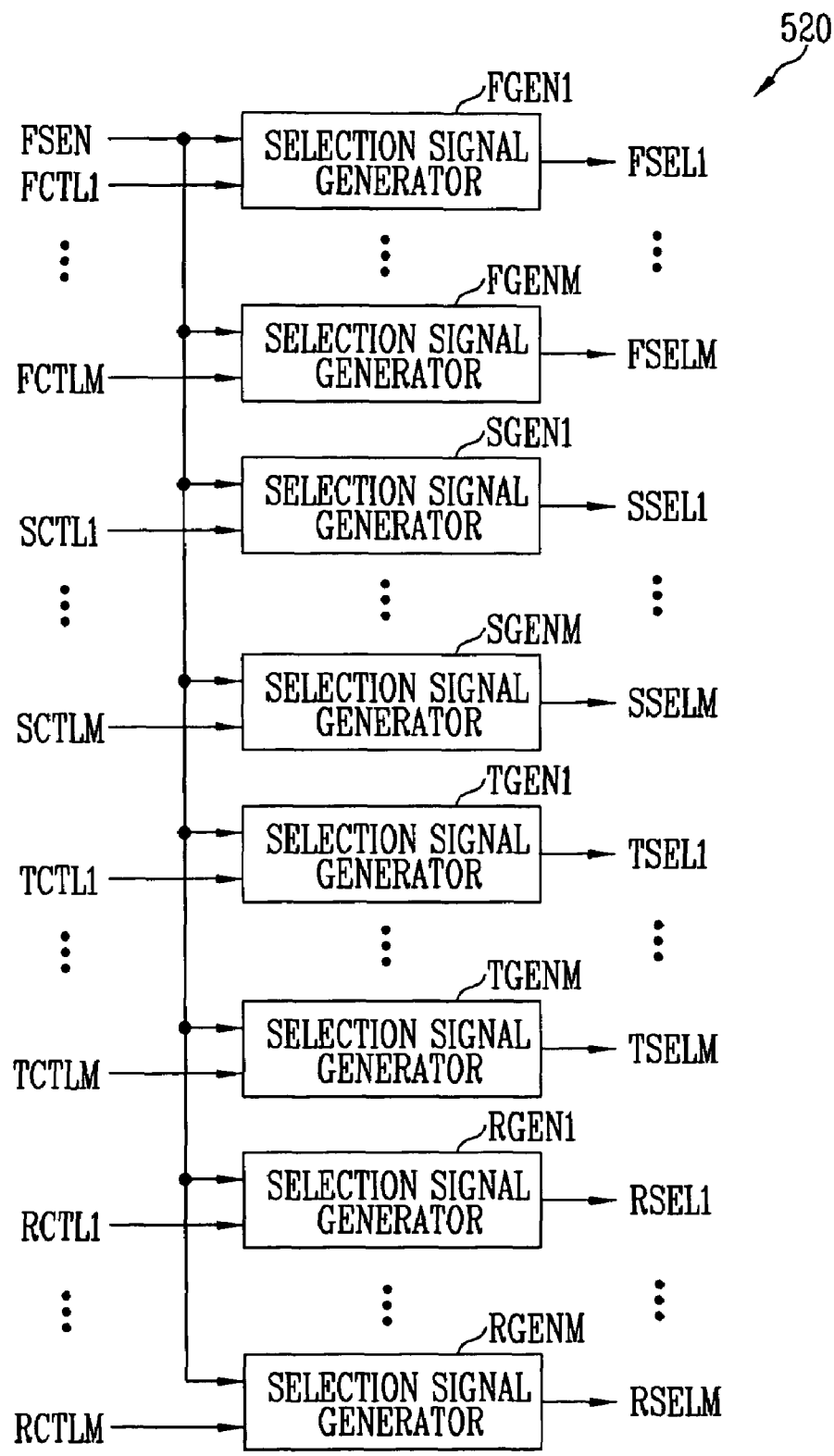
FIG. 7 is a detailed circuit diagram of a fuse box circuit shown in FIG. 6 according to an embodiment of the present invention.

The construction and operation of the fuse box circuit 520 will be described below in more detail with reference to FIG. 7. The fuse box circuit 520 includes selection signal generators FGEN1 to FGENM, SGEN1 to SGENM, TGEN1 to TGENM, and RGEN1 to RGENM (M is an integer). The selection signal generators FGEN1 to FGENM generate first selection signals FSEL1 to FSELM, respectively, in response to the fuse enable signal FSEN or the first control signals FCTL1 to FCTLM, respectively. The selection signal generators SGEN1 to SGENM generate second selection signals SSEL1 to SSELM, respectively, in response to the fuse enable signal FSEN or the second control signals SCTL1 to SCTLM, respectively.

Furthermore, the selection signal generators TGEN1 to TGENM generate third selection signals TSEL1 to TSELM, respectively, in response to the fuse enable signal FSEN or the third control signals TCTL1 to TCTLM, respectively. The selection signal generators RGEN1 to RGENM generate fourth selection signals RSEL1 to RSELM, respectively, in response to the fuse enable signal FSEN or the fourth control signals RCTL1 to RCTLM, respectively.

The construction and detailed operation of each of the selection signal generators FGEN1 to FGENM, SGEN1 to SGENM, TGEN1 to TGENM, and RGEN1 to RGENM are substantially the same as those of the selection signal generator 121 that has been described with reference to FIG. 3. Description thereof will be omitted.

Referring to back FIG. 6, the line width change circuits FW1 to FWM connect or disconnect one of or both the dummy lines DML1, DML2 of the dummy line groups DG1 to DGM to or from the power lines PWL1 of the power line groups PG1 to PGM in response to the first and second selection signals FSEL1 to FSELM, SSEL1 to SSELM. Each of the line width change circuits FW1 to FWM includes switching circuits S1, S2. The switching circuit S1 includes NMOS transistors 531, 532 and the switching circuit S2 includes NMOS transistors 533, 534.

Furthermore, the line width change circuits SW1 to SWM connect or disconnect one of or both the dummy lines DML1, DML2 of the dummy line groups DG1 to DGM to or from the power lines PWL2s of the power line groups PG1 to PGM in response to the third and fourth selection signals TSEL1 to TSELM, RSEL1 to RSELM, respectively. Each of the line width change circuits SW1 to SWM includes switching circuits S3, S4. The switching circuit S3 includes NMOS transistors 535, 536 and the switching circuit S4 includes NMOS transistors 537, 538.

As described above, the power line control circuit 500 can freely control the widths of the power lines PWL1, PWL2 of each of the power line groups PG1 to PGM that transmit different internal voltages.

Figure 8:
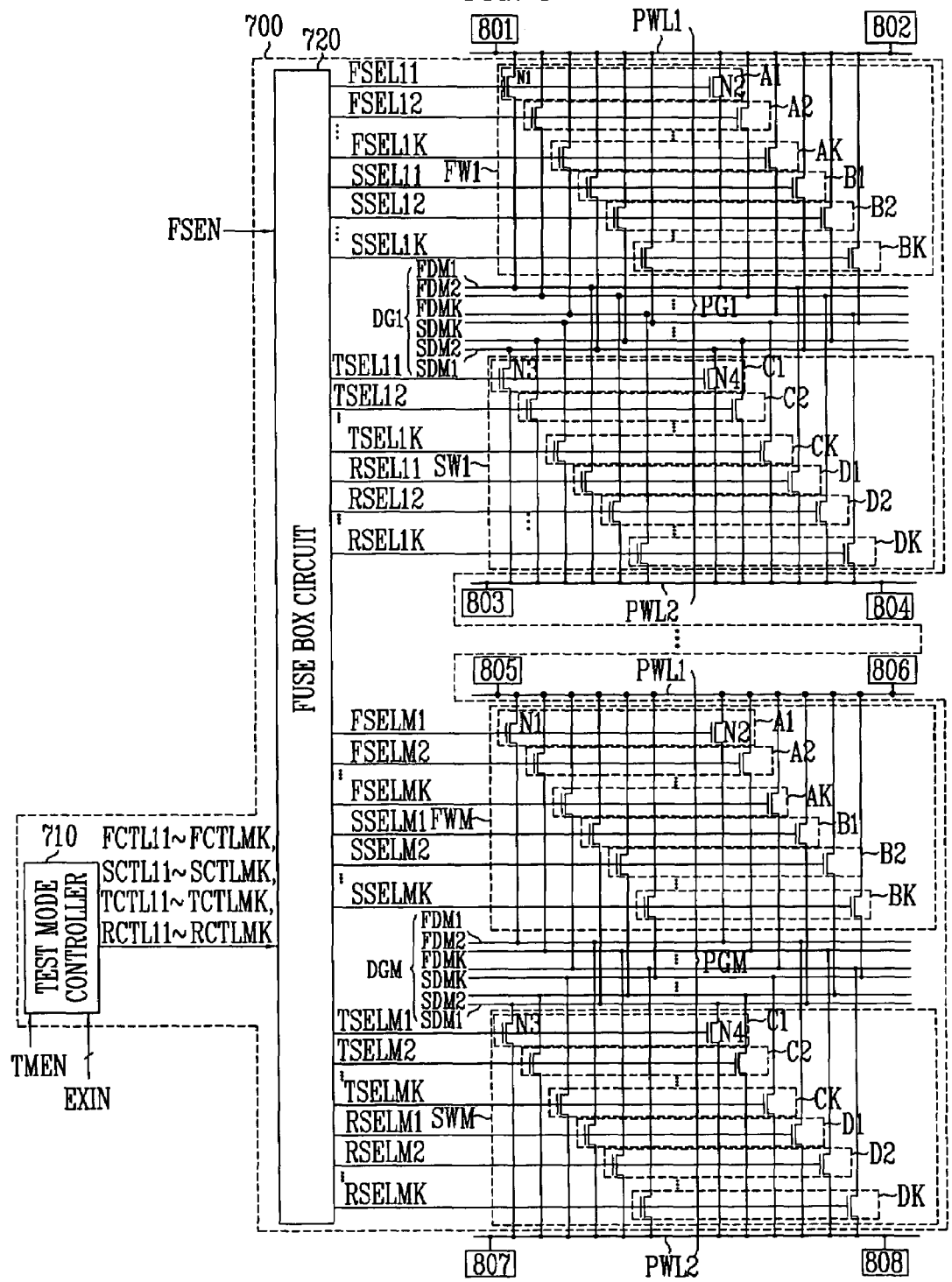
FIG. 8 is a circuit diagram illustrating a power line control circuit, power lines and internal circuits of a semiconductor device according to a fourth embodiment of the present invention.

FIG. 8 is a circuit diagram illustrating a power line control circuit, power lines and internal circuits of a semiconductor device according to a fourth embodiment of the present invention.

Referring to FIG. 8, the power line control circuit 700 includes a test mode controller 710, a fuse box circuit 720, dummy line groups DG1 to DGM (M is an integer), and line width change circuits FW1 to FWM, SW1 to SWM (M is an integer). The construction and operation of the power line control circuit 700 are substantially the same as those of the power line control circuit 500 according to the third embodiment except for several differences. Accordingly, only the differences will be described.

Each of the dummy line groups DG1 to DGM includes a plurality of dummy lines FDM1 to FDMK, SDM1 to SDMK (K is an integer). The dummy lines FDM1 to FDMK, SDM1 to SDMK of each of the dummy line groups DG1 to DGM are disposed between power lines PWL1, PWL2 of each of the power line groups PG1 to PGM.

For example, the dummy lines FDM1 to FDMK, SDM1 to SDMK of the dummy line group DG1 may be disposed between the power lines PWL1, PWL2 of the power line group PG1. The power line groups PG1 to PGM operate as paths along which different internal voltages are transmitted.

Furthermore, the test mode controller 710 is enabled when a test mode control signal TMEN is enabled and generates first to fourth control signals FCTL11 to FCTLMK, SCTL11 to SCTLMK, TCTL11 to TCTLMK, and RCTL11 to RCTLMK based on a bit value of an externally inputted signal EXIN. At this time, the test mode controller 710 enables a portion of the first to fourth control signals FCTL11 to FCTLMK, SCTL11 to SCTLMK, TCTL11 to TCTLMK, and RCTL11 to RCTLMK.

Figure 9:
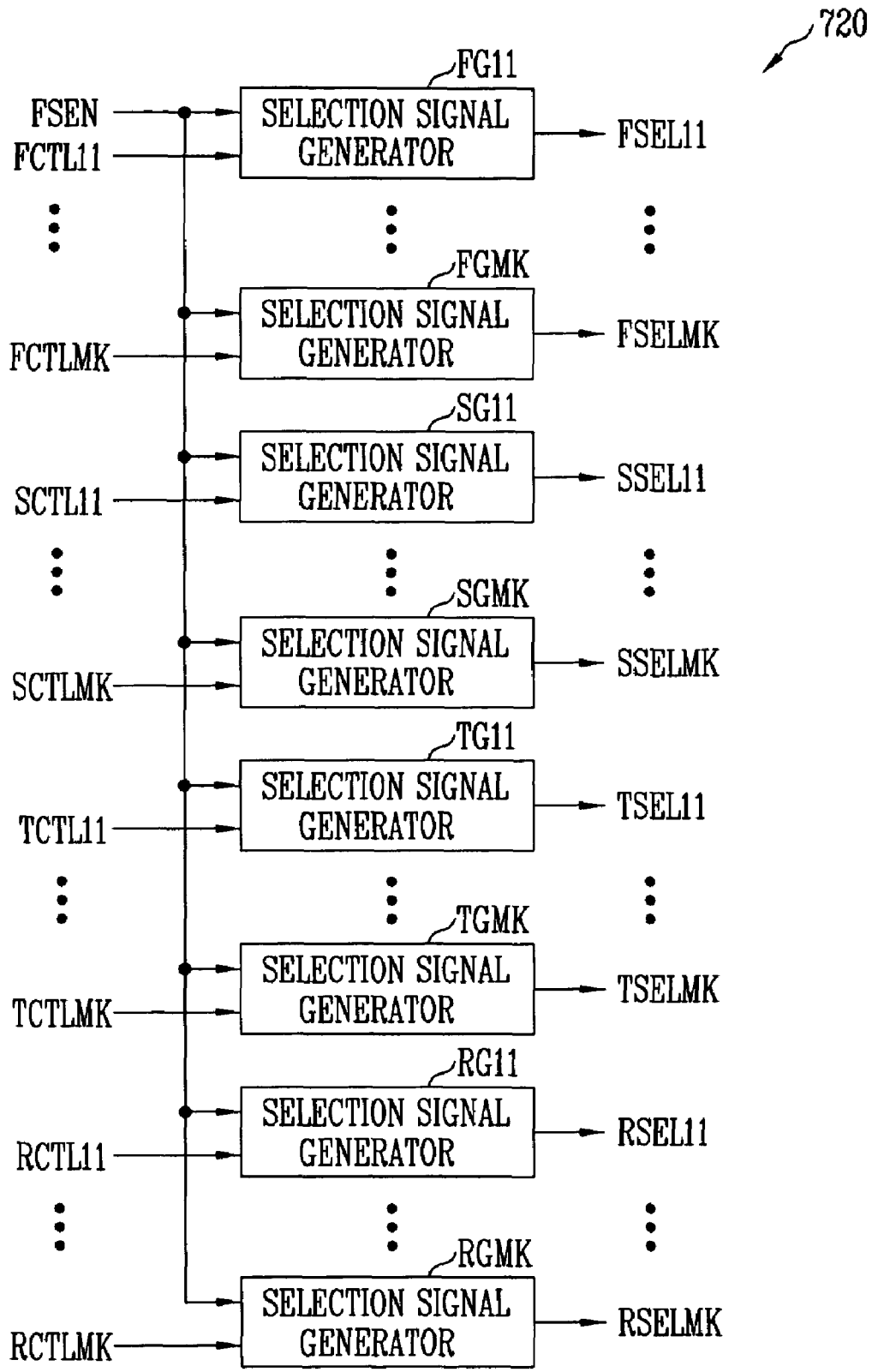
FIG. 9 is a detailed circuit diagram of a fuse box circuit shown in FIG. 8 according to an embodiment of the present invention.

The construction and operation of the fuse box circuit 720 will be described below in more detail with reference to FIG. 9.

The fuse box circuit 720 includes selection signal generators FG11 to FGMK, SG11 to SGMK, TG11 to TGMK, and RG11 to RGMK (M, K is an integer).

The selection signal generators FG11 to FGMK generate first selection signals FSEL11 to FSELMK, respectively, in response to the fuse enable signal FSEN or the first control signals FCTL11 to FCTLMK, respectively. The selection signal generators SG11 to SGMK generate second selection signals SSEL11 to SSELMK, respectively, in response to the fuse enable signal FSEN or the second control signals SCTL11 to SCTLMK, respectively. The selection signal generators TG11 to TGMK generate third selection signals TSEL11 to TSELMK, respectively, in response to the fuse enable signal FSEN or the third control signals TCTL11 to TCTLMK, respectively.

The selection signal generators RG11 to RGMK generate fourth selection signals RSEL11 to RSELMK, respectively, in response to the fuse enable signal FSEN or the fourth control signals RCTL11 to RCTLMK, respectively. The construction and detailed operation of each of the selection signal generators FG11 to FGMK, SG11 to SGMK, TG11 to TGMK, and RG11 to RGMK are substantially the same as those of the selection signal generator 121 that has described with reference to FIG. 3. Description thereof will be omitted.

Referring back to FIG. 8, each of the line width change circuits FW1 to FWM includes a plurality of switching circuits A1 to AK, B1 to BK (K is an integer). Each of the line width change circuits SW1 to SWM includes a plurality of switching circuits C1 to CK, D1 to DK (K is an integer). Each of the switching circuits A1 to AK, B1 to BK includes NMOS transistors N1, N2. Each of the switching circuits C1 to CK, D1 to DK includes NMOS transistors N3, N4.

The line width change circuits FW1 to FWM connect or disconnect a portion of the dummy lines FDM1 to FDMK, SDM1 to SDMK of the dummy line groups DG1 to DGM to or from the power lines PWL1s of the power line groups PG1 to PGM, respectively, in response to the first and second selection signals FSEL11 to FSELMK, SSEL11 to SSELMK, respectively.

Furthermore, the line width change circuits SW1 to SWM connect or disconnect a portion of the dummy lines FDM1 to FDMK, SDM1 to SDMK of the dummy line groups DG1 to DGM to or from the power lines PWL2s of the power line groups PG1 to PGM, respectively, in response to the third and fourth selection signals TSEL11 to TSELMK, RSEL11 to RSELMK, respectively.

As described above, the power line control circuit 700 can freely control the widths of the power lines PWL1, PWL2 of each of the power line groups PG1 to PGM that transmit different internal voltages. Furthermore, the power line control circuit 700 can control the widths of the power lines PWL1, PWL2 more accurately in comparison with the power line control circuit 500.

As described above, the power line control circuit of the semiconductor device according to the present invention can selectively control the width of each power line employing the dummy power lines. It is therefore possible to easily change the width of the power lines and to reduce the manufacturing cost and the manufacturing time depending on the formation of the power lines.

Furthermore, the power line control circuit of the semiconductor device according to the present invention can selectively control the width of the power lines, if appropriate. Accordingly, mesh of optimized power lines can be provided. Furthermore, more stabilized product characteristics can be secured and the yield of semiconductor memory devices can be enhanced.

In addition, the power line control circuit of the semiconductor device according to the present invention can selectively change power mesh corresponding to a power line method or operation mode of a product.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A power line control circuit of a semiconductor device, the power line control circuit comprising:
   a first dummy line disposed adjacent to a first power line that transmits a first internal voltage to first internal circuits;
   a second dummy line disposed adjacent to a second power line that transmits a second internal voltage to second internal circuits;
   a first line width change circuit that connects or disconnects one of or both the first and second dummy lines to or from the first power line in response to first and second selection signals, thereby selectively changing the width of the first power line; and
   a second line width change circuit that connects or disconnects one of or both the first and second dummy lines to or from the second power line in response to third and fourth selection signals, thereby selectively changing the width of the second power line.

2. The power line control circuit as claimed in claim 1, further comprising:
   a test mode controller that generates first to fourth control signals in response to a test mode control signal and an externally inputted signal; and
   a fuse box circuit that generates the first to fourth selection signals in response to a fuse enable signal or the first to fourth control signals.

3. The power line control circuit as claimed in claim 2, wherein the externally inputted signal comprises a plurality of bits,
   wherein when one of the test mode control signal and the fuse enable signal is enabled, the other of the test mode control signal and the fuse enable signal is disabled, and
   when the test mode control signal is enabled, the test mode controller is enabled and generates the first to fourth control signals based on a bit value of the externally inputted signal.

4. The power line control circuit as claimed in claim 3, wherein the fuse box circuit comprises a plurality of fuses, and
   when the fuse enable signal is disabled, the fuse box circuit generates the first to fourth selection signals in response to the first to fourth control signals, and when the fuse enable signal is enabled, the fuse box circuit generates the first to fourth selection signals depending on whether each of the plurality of fuses has been cut.

5. The power line control circuit as claimed in claim 2, wherein the fuse box circuit comprises first to fourth selection signal generators that generate the first to fourth selection signals, respectively, in response to the fuse enable signal or the first to fourth control signals, respectively.

6. The power line control circuit as claimed in claim 5, wherein each of the first to fourth selection signal generators comprises:
   a test operation circuit that generates one of first to fourth internal signals to an output node in response to one of the first to fourth control signals;

a normal operation circuit that generates one of first to fourth fuse signals to the output node in response to the fuse enable signal; and an output circuit which receives one of the first to fourth internal signals or one of the first to fourth fuse signals, which are received from the output node, and outputs a received signal as one of the first to fourth selection signals.

7. The power line control circuit as claimed in claim 6, wherein when one of the test operation circuit and the normal operation circuit is enabled and operates, the other of the test operation circuit and the normal operation circuit is disabled and stops its operation.

8. The power line control circuit as claimed in claim 6, wherein the test operation circuit is enabled when one of the first to fourth control signals is enabled and outputs one of the first to fourth internal signals to the output node as a first voltage level, and the normal operation circuit is enabled when the fuse enable signal is enabled and outputs one of the first to fourth fuse signals to the output node as the first voltage or a second voltage level.

9. The power line control circuit as claimed in claim 8, wherein the normal operation circuit comprises:

an inverter that inverts the fuse enable signal and outputs an inverted fuse enable signal;

a first switching circuit that is connected to the second voltage and is turned on or off in response to the fuse enable signal;

a second switching circuit which is connected between the first voltage and the output node and is turned on or off in response to the inverted fuse enable signal; and a fuse connected between the output node and the first switching circuit.

10. The power line control circuit as claimed in claim 9, wherein the normal operation circuit outputs one of the first to fourth fuse signals as the first voltage level when the fuse is cut, and outputs one of the first to fourth fuse signals as the second voltage level when the fuse is not cut.

11. The power line control circuit as claimed in claim 6, wherein the output circuit comprises:

a latch circuit that latches one of the first to fourth internal signals or one of the first to fourth fuse signals, which are received from the output node, and outputs a latched signal; and an inverter that inverts the latched signal and outputs the inverted signal as one of the first to fourth selection signals.

12. The power line control circuit as claimed in claim 1, wherein when the first line width change circuit connects the second dummy line to the first power line, the second line width change circuit separates the second dummy line from the second power line, and when the second line width change circuit connects the first dummy line to the second power line, the first line width change circuit separates the first dummy line from the first power line.

13. The power line control circuit as claimed in claim 1, wherein the first line width change circuit comprises:

a first switching circuit that is connected between the first power line and the first dummy line and is turned on or off in response to the first selection signal; and a second switching circuit that is connected between the first power line and the second dummy line and is turned on or off in response to the second selection signal, and the second line width change circuit comprises:

a third switching circuit that is connected between the second power line and the second dummy line and is turned on or off in response to the third selection signal; and a fourth switching circuit that is connected between the second power line and the first dummy line and is turned on or off in response to the fourth selection signal.

14. The power line control circuit as claimed in claim 5, wherein the test mode controller further generates first to fourthJ (J is an integer) control signals in response to the test mode control signal and the externally inputted signal, and the fuse box circuit further generates first to fourthJ additional selection signals in response to the fuse enable signal or the first to fourthJ additional control signals.

15. The power line control circuit as claimed in claim 14, further comprising:

first additional dummy lines disposed close to the first dummy line;

second additional dummy lines disposed close to the second dummy line;

a first additional line width change circuit that connects or disconnects a part or all of the first and second additional dummy lines to or from the first power line in response to the first and secondJ additional selection signals, thereby selectively changing a width of the first power line; and a second additional line width change circuit that connects or disconnects a part or all of the first and second additional dummy lines to the second power line in response to the $(2J+1)^{th}$ to the fourthJ additional selection signals, thereby selectively changing a width of the second power line.

16. The power line control circuit as claimed in claim 14, wherein the fuse box circuit further comprises first to fourthJ additional selection signal generators that generate the first to fourthJ additional selection signals, respectively, in response to the fuse enable signal or the first to fourthJ additional control signals.

17. The power line control circuit as claimed in claim 16, wherein each of the first to fourthJ additional selection signal generators comprises:

a test operation circuit that generates one of first to fourthJ additional internal signals to the output node in response to one of the first to fourthJ additional control signals;

a normal operation circuit that generates one of first to fourthJ additional fuse signals to the output node in response to the fuse enable signal; and an output circuit that receives one of the first to fourthJ additional internal signals or one of the first to fourthJ additional fuse signals, which are received from the output node, and outputs a received signal as one of the first to fourthJ additional selection signals.

18. The power line control circuit as claimed in claim 17, wherein when one of the test operation circuit and the normal operation circuit is enabled and operates, the other of the test operation circuit and the normal operation circuit stops its operation.

19. The power line control circuit as claimed in claim 17, wherein when the test operation circuit is enabled, the test operation circuit outputs one of the first to fourthJ additional internal signals to the output node as a first voltage level in response to one of the first to fourthJ additional control signals, and when the normal operation circuit is enabled, the normal operation circuit outputs one of the first to fourthJ additional fuse signals to the output node as the first voltage or a second voltage level in response to the fuse enable signal.

20. The power line control circuit as claimed in claim 19, wherein the normal operation circuit comprises
   an inverter that inverts the fuse enable signal and outputs an inverted fuse enable signal;
   a first switching circuit that is connected to the second voltage and is turned on or off in response to the fuse enable signal;
   a second switching circuit which is connected between the first voltage and the output node and is turned on or off in response to the inverted fuse enable signal; and
   a fuse connected between the output node and the first switching circuit.

21. The power line control circuit as claimed in claim 20, wherein the normal operation circuit outputs one of the first to fourthJ additional fuse signals as the first voltage level when the fuse is cut, and outputs one of the first to fourth additional fuse signals as the second voltage level when the fuse is not cut.

22. The power line control circuit as claimed in claim 15, wherein when the first additional line width change circuit connects a part or all of the second additional dummy lines to the first power line, the second additional line width change circuit disconnects a part or all of the second additional dummy lines from the second power line, and
   when the second additional line width change circuit connects a part or all of the first additional dummy lines to the second power line, the first additional line width change circuit disconnects a part or all of the first additional dummy lines from the first power line.

23. The power line control circuit as claimed in claim 15, wherein the first additional line width change circuit comprises:
   first to $j^{th}$ additional switching circuits which are connected between the first power line and the first additional dummy lines, respectively, and are turned on or off in response to the first to $J^{th}$ additional selection signals; and
   $(J+1)^{th}$ to secondJ additional switching circuits which are connected between the first power line and the second additional dummy lines, respectively, and are turned on or off in response to the $(J+1)^{th}$ to secondJ additional selection signals,
   the second additional line width change circuit comprises:
   $(2J+1)^{th}$ to thirdJ additional switching circuits which are connected between the second power line and the second additional dummy lines, respectively, and are turned on or off in response to the $(2J+1)^{th}$ to thirdJ additional selection signals; and
   $(3J+1)^{th}$ to fourthJ additional switching circuits which are connected between the second power line and the first additional dummy lines, respectively, and are turned on or off in response to the $(3J+1)^{th}$ to fourthJ additional selection signals.

24. A power line control circuit of a semiconductor device, the power line control circuit comprising:
   first to $M^{th}$ (M is an integer) dummy line groups, which are included in first to $M^{th}$ (M is an integer) power line groups, respectively, and include first and second dummy lines respectively disposed between first and second power lines that transmit different internal voltages, respectively;
   first line width change circuits that connect or disconnect one or all of the first and second dummy lines of each of the first to $M^{th}$ dummy line groups to or from the first power line of each of the first to $M^{th}$ power line groups in response to first selection signals and second selection signals, respectively, thereby selectively changing a width of each of the first power lines; and
   second line width change circuits that connect or disconnect one or all of the first and second dummy lines of each of the first to $M^{th}$ dummy line groups to or from the second power line of each of the first to $M^{th}$ power line groups in response to third selection signals and fourth selection signals, respectively, thereby selectively changing a width of each of the second power lines.

25. The power line control circuit as claimed in claim 24, further comprising:
   a test mode controller that generates first control signals, second control signals, third control signals, and fourth control signals in response to a test mode control signal and an externally inputted signal; and
   a fuse box circuit that generates the first to fourth selection signals in response to a fuse enable signal or the first to fourth control signals.

26. The power line control circuit as claimed in claim 25, wherein the fuse box circuit comprises:
   first selection signal generators that generate the first selection signals, respectively, in response to the fuse enable signal or the first control signals, respectively;
   second selection signal generators that generate the second selection signals, respectively, in response to the fuse enable signal or the second control signals, respectively;
   third selection signal generators that generate the third selection signals, respectively, in response to the fuse enable signal or the third control signals, respectively; and
   fourth selection signal generators that generate the fourth selection signals, respectively, in response to the fuse enable signal or the fourth control signals, respectively.

27. The power line control circuit as claimed in claim 26, wherein each of the first to fourth selection signal generators comprises a fuse, and
   when the fuse enable signal is disabled, each of the first to fourth selection signal generators generates one of the first to fourth selection signals in response to one of the first to fourth control signals, and when the fuse enable signal is enabled, each of the first to fourth selection signal generators generates one of the first to fourth selection signals depending on whether the fuse has been cut.

28. A power line control circuit of a semiconductor device, comprising:
   first to $M^{th}$ (M is an integer) dummy line groups, which are included in first to $M^{th}$ (M is an integer) power line groups, respectively, and include first and secondK (K is an integer) dummy lines respectively disposed between first and second power lines that transmit different internal voltages, respectively;
   first line width change circuits that connect or disconnect one or all of the first and secondK dummy lines of each of the first to $M^{th}$ dummy line groups to or from the first power line of each of the first to $M^{th}$ power line groups in response to first selection signals and second selection signals, respectively, thereby selectively changing a width of each of the first power lines; and second line width change circuits that connect or disconnect one or all of the first and secondK dummy lines of each of the first to $M^{th}$ dummy line groups to or from the second power line of each of the first to $M^{th}$ power line groups in response to third selection signals and fourth selection signals, respectively, thereby selectively changing a width of each of the second power lines.

29. The power line control circuit as claimed in claim 28, further comprising:
   a test mode controller that generates first control signals, second control signals, third control signals, and fourth control signals in response to a test mode control signal and an externally inputted signal; and
   a fuse box circuit that generates the first to fourth selection signals in response to a fuse enable signal or the first to fourth control signals.

30. The power line control circuit as claimed in claim 29, wherein the fuse box circuit comprises:
   first selection signal generators that generate the first selection signals, respectively, in response to the fuse enable signal or the first control signals, respectively;
   second selection signal generators that generate the second selection signals, respectively, in response to the fuse enable signal or the second control signals, respectively;
   third selection signal generators that generate the third selection signals, respectively, in response to the fuse enable signal or the third control signals, respectively; and
   fourth selection signal generators that generate the fourth selection signals, respectively, in response to the fuse enable signal or the fourth control signals, respectively.

31. The power line control circuit as claimed in claim 30, wherein each of the first to fourth selection signal generators comprises a fuse, and
   when the fuse enable signal is disabled, each of the first to fourth selection signal generators generates one of the first to fourth selection signals in response to one of the first to fourth control signals, and when the fuse enable signal is enabled, each of the first to fourth selection signal generators generates one of the first to fourth selection signals depending on whether the fuse has been cut.

32. A power line control circuit of a semiconductor device, the power line control circuit comprising:
   a power line for transmitting a internal voltage to internal circuits;
   a dummy line disposed adjacent the power line; and
   a power line width change circuit that connects or disconnects the dummy line to or from the power line in response to a selection signal thereby selectively changing the width of the power line.

33. The power line control circuit as claimed in claim 32, further comprising:
   a test mode controller that generates a control signal in response to a test mode control signal and an externally inputted signal; and
   a fuse box circuit that generates the selection signal in response to a fuse enable signal or the control signal.

34. The power line control circuit as claimed in claim 32, wherein the power line width change circuit comprises:
   a first line width change circuit that connects or disconnects one of or both the first and second dummy lines to or from the first power line in response to first and second selection signals, thereby selectively changing the width of the first power line; and
   a second line width change circuit that connects or disconnects one of or both the first and second dummy lines to or from the second power line in response to third and fourth selection signals, thereby selectively changing the width of the second power line.

* * * * *